(12) United States Patent  (10) Patent No.: US 7,075,079 B2
Wood  (45) Date of Patent: Jul. 11, 2006

(54) SENSOR FOR DUAL WAVELENGTH BANDS

(76) Inventor: Roland A. Wood, 150 Mission La. East, Bloomington, MN (US) 55420

( * ) Notice: Subject to any disclaimer, the term of this patent is extended or adjusted under 35 U.S.C. 154(b) by 267 days.

(21) Appl. No.: 09/893,066

(22) Filed: Jun. 27, 2001

(65) Prior Publication Data

US 2003/0001093 A1 Jan. 2, 2003

(51) Int. Cl.
*H01L 25/00* (2006.01)
(52) U.S. Cl. ................ 250/332; 250/339.05
(58) Field of Classification Search ............... 250/332, 250/208.1, 226, 216, 573, 339.05; 257/442, 257/440, 461, 78
See application file for complete search history.

(56) References Cited

U.S. PATENT DOCUMENTS

| | | | |
|---|---|---|---|
| 4,296,324 A * | 10/1981 | Kern et al. ............ 250/339.15 |
| 4,867,850 A * | 9/1989 | Oka et al. ..................... 205/50 |
| 4,952,995 A * | 8/1990 | Phillips et al. .............. 257/227 |
| 5,001,558 A | 3/1991 | Burley et al. ............... 358/113 |
| 5,126,554 A * | 6/1992 | Ranson ........................ 250/216 |
| 5,161,107 A * | 11/1992 | Mayeaux et al. ........... 701/117 |
| 5,373,182 A | 12/1994 | Norton ........................ 257/440 |
| 5,420,419 A | 5/1995 | Wood ....................... 250/338.4 |
| 5,518,934 A * | 5/1996 | Forrest et al. ................. 438/73 |
| 5,534,694 A * | 7/1996 | Ball et al. .................... 250/330 |
| 5,567,975 A * | 10/1996 | Walsh et al. ................. 257/442 |
| 5,777,329 A | 7/1998 | Westphal et al. ....... 250/339.02 |
| 5,808,350 A | 9/1998 | Jack et al. ................... 257/440 |
| 5,811,815 A | 9/1998 | Marshall et al. ........ 250/370.06 |
| 5,841,137 A | 11/1998 | Whitney ................... 250/338.5 |
| 5,861,625 A | 1/1999 | Wurden .................... 250/338.1 |
| 5,929,432 A | 7/1999 | Yamakawa ................ 250/280.1 |
| 6,094,127 A | 7/2000 | Yong ............................ 338/15 |
| 6,097,031 A | 8/2000 | Cole ..................... 250/370.06 |
| 6,107,618 A | 8/2000 | Fossum et al. ........... 250/208.1 |
| 6,150,930 A * | 11/2000 | Cooper ....................... 340/435 |
| 6,157,404 A | 12/2000 | Marshall et al. ............ 348/207 |
| 6,163,061 A | 12/2000 | Iida ............................. 257/467 |
| 6,188,069 B1 | 2/2001 | Endoh ...................... 250/338.1 |
| 6,198,099 B1 | 3/2001 | Kim ......................... 250/338.1 |
| 6,211,520 B1 | 4/2001 | Ishikawa et al. ......... 250/338.1 |
| 6,316,770 B1 * | 11/2001 | Ouvrier-Buffet et al. 250/338.1 |
| 6,320,189 B1 * | 11/2001 | Ouvrier-Buffet et al. 250/338.4 |
| 6,377,191 B1 * | 4/2002 | Takubo ....................... 340/937 |
| 6,411,328 B1 * | 6/2002 | Franke et al. ............... 348/149 |
| 6,442,473 B1 * | 8/2002 | Berstis et al. ............... 701/117 |
| 2002/0008191 A1 * | 1/2002 | Faska et al. ............. 250/208.1 |
| 2003/0001121 A1 * | 1/2003 | Hochstein ................... 250/573 |

FOREIGN PATENT DOCUMENTS

JP 63167577 7/1988

* cited by examiner

*Primary Examiner*—Otilia Gabor
(74) *Attorney, Agent, or Firm*—Kris T. Fredrick

(57) ABSTRACT

A dual wavelength focal plane has a first array of infrared sensing pixel elements and a second array of visible light pixel elements adapted to be selective to colors encountered while driving an automobile. The second array is selective to the colors red, blue and green, so being selective to traffic control signals, including brake lights of other automobiles. The arrays are vertically stacked on a monolithic silicon substrate. The arrays are electrically coupled to a processor and display to integrate the infrared and color pixel elements into a view for a driver of the automobile.

19 Claims, 1 Drawing Sheet

SENSOR FOR DUAL WAVELENGTH BANDS

FIELD OF THE INVENTION

The present invention relates to sensors, and in particular to a sensor for at least two wavelength bands such as infrared and visible color wavelengths.

BACKGROUND OF THE INVENTION

Microbolometer arrays are arrays of IR sensors used to sense infrared (IR) light. The sensors are formed in an array on a semiconductor substrate in a well known manner. IR light is focused on the array via optics. When coupled to a display, the microbolometer array provides a heat based (IR) image, such as currently used in some automobiles to provide night vision to a driver. These have been extremely useful for providing visual images of humans and other animals well before they can be seen by the eye with the aid of headlights.

One problem associated with such displays is that they do not show other information which is required for safe driving, such as traffic control lights. The display may show whether a light is on or off by the heat that it generates, but the heating effect is slow and hence is not a reliable indication. Thus, there is no way to safely determine the color of the light. It should be noted that some states allow lights to be positioned horizontally. Remembering which side of the light is red may be difficult for many drivers.

SUMMARY OF THE INVENTION

A dual wavelength focal plane has a first array of infrared sensing pixel elements and a second array of visible light pixel elements adapted to be selective to colors encountered while driving an automobile. The second array is selective to the colors red, blue and green, corresponding to traffic control signals, including brake lights of other automobiles.

In one embodiment, the first and second arrays are fabricated on a monolithic silicon substrate. The arrays are electrically coupled to a processor and display to integrate the infrared and color pixel elements into a view for a driver of the automobile.

In a further embodiment, the second array comprises sets of three silicon photodiodes adapted to be selective to red, blue and green respectively, each set of photodiodes formed on the silicon substrate beneath the infrared sensing pixel element.

A heads up display for enhancing visibility for night time drivers of vehicles is provided by sensing infrared radiation sources generally in the path of the vehicle, selectively sensing visible radiation corresponding to traffic control colors, and combining the sensed visible radiation and infrared radiation to provide images for the heads up display. The traffic control colors are displayed in color.

In still a further embodiment, a CCD array is used as the second array for sensing visible light. The processor then utilizes digital filtering to separate out red, amber and green traffic control colors and superimposes those on the image from the infrared sensing array.

DETAILED DESCRIPTION OF THE INVENTION

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1:
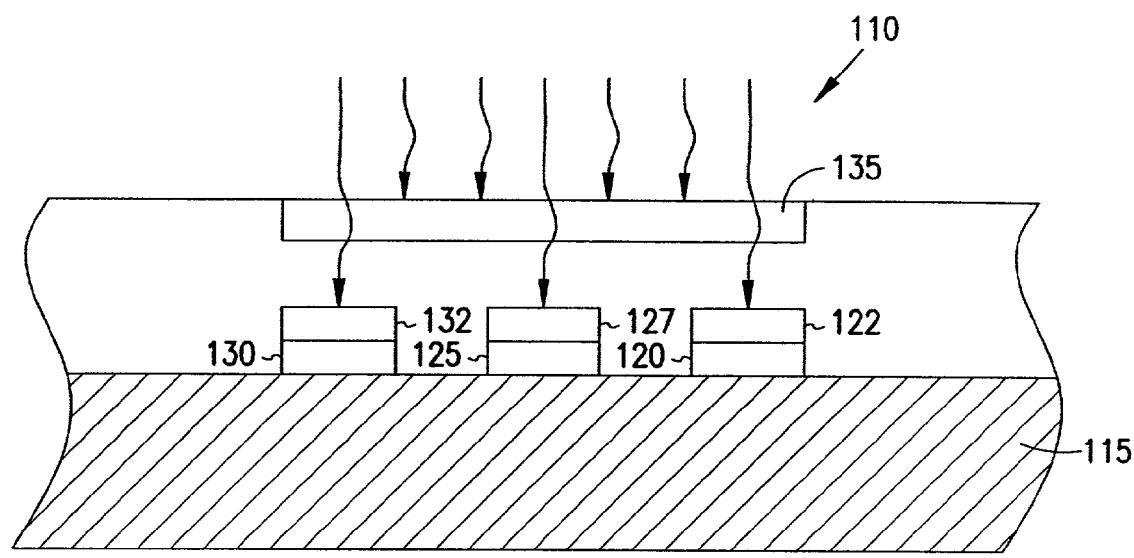
FIG. 1 is a block cross section of a substrate having sensors for multiple wavelengths.

A single monolithic un-cooled silicon focal plane is shown generally at 110 in FIG. 1. The focal plane is capable of imaging both infrared (IR) and visible wavelengths. One pixel is shown in FIG. 1. The pixel is formed on a silicon substrate 115, and comprises a infrared-sensitive pixel 135 and a plurality of visible-light photosensors 120, 125 and 130, corresponding to selected colors. A filter is provided for each photosensor as indicated at 122, 127 and 132, to make the photosensors sensitive to certain colors, such as red, blue and green light bandwidths respectively. Such bandwidths generally correspond to vehicle traffic control signals. Vehicles include for example, automobiles, trains, boats and airplanes, as well as other vehicles. The photosensors may be made selective to other colors as desired.

In one embodiment, a single visible photosensor is fabricated with each bolometer pixel, and only red light is allowed to fall onto the array, by means of a red filter in the optical path.

A microbolometer 135 is formed above the photosensors and separated therefrom by a thermally-isolating space. The microbolometer may be formed in many different ways as shown in the art, but with minimal metalization to enhance transmission of visible light to the underlying visible photosensors. When formed in this manner, the microbolometer and photosensors are vertically stacked on a monolithic silicon substrate. The arrays are vertically integrated into an monolithic silicon substrate to optimize fill factor.

Figure 2:
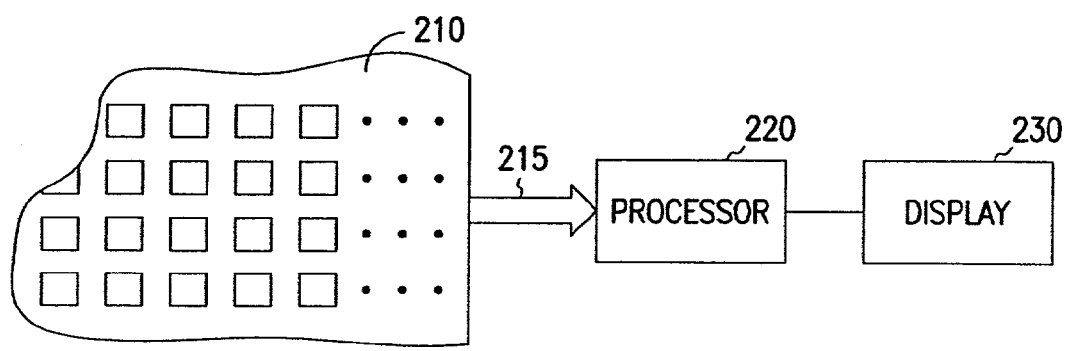
FIG. 2 is a block diagram of a system for displaying images produced by an array of sensors from FIG. 1.

A system for providing a heads up display is shown in FIG. 2. An array of pixels comprising the focal planes of FIG. 1 are shown in a partial cutaway block representation at 210. Connections to each of the sensors in each pixel are represented at 215, and are made in any of many well known manners. The connections 215 are coupled to a processor 220. Processor 220 is formed in the same substrate as the array of pixels in one embodiment, or may be an independent processor. Processor 220 processes the inputs from the array 210 to combine the IR monochrome image signals with the photosensor color signals to provide an image for display by display 230, such as a common heads up display. The processor may also be integrated into display 230. The display 230 provides a monochrome image corresponding to the IR signals, overlaid with colors provided by the photosensors.

By sensing IR sources generally in the path of the vehicle, selectively sensing visible radiation corresponding to traffic control colors, and combining the sensed visible radiation and infrared radiation to provide images for the heads up display, traffic control colors are displayed in color over a monochrome representation of the sensed IR.

The invention claimed is:

1. A dual wavelength focal plane comprising:
   a first array of infrared sensing microbolometer pixel elements;
   a second array of visible light pixel elements responsive to selective colors encountered while driving an automobile such that traffic control colors are optimally sensed.

2. The focal plane of claim 1 wherein the second array is selective to the color red.

3. The focal plane of claim 1 wherein the second array is selective to the colors red, green and blue.

4. The focal plane of claim 1 wherein the first and second arrays are fabricated on a monolithic silicon substrate.

5. The focal plane of claim 1 and further comprising a visible light filter that passes red light to the second array of visible light pixel elements.

6. The focal plane of claim 1 and further comprising multiple filters for selectively passing red, green and blue light to the second array of visible light pixel elements.

7. A dual wavelength focal plane comprising:
   a first array of infrared sensing microbolometer pixel elements;
   a second array of sets of three pixel elements optimally selective to red, blue and green respectively such that traffic control colors are optimally sensed.

8. A sensor for aiding an automobile driver at night, the sensor comprising:
   a first array of infrared sensing microbolometer pixel elements formed on a silicon substrate;
   a second array of sets of three visible sensors optimally responsive to red, blue and green respectively, each set of photosensors formed on the silicon substrate beneath the infrared sensing pixel element such that traffic control colors are optimally sensed.

9. A night display system for an automobile, the system comprising:
   a first array of infrared sensing microbolometer pixel elements;
   a second array of photosensors responsive to traffic control signals; and,
   a heads up display coupled to the arrays for generating an image based on infrared images and visible light corresponding to traffic control signals.

10. A method of providing a heads up display for enhancing visibility for night time drivers of vehicles, the method comprising:
    sensing infrared radiation sources generally in the path of the vehicle using a microbolometer;
    selectively sensing visible radiation corresponding to traffic control colors; and
    combining the sensed visible radiation and infrared radiation to provide images for the heads up display, wherein the traffic control colors are displayed in color.

11. The method of claim 10 wherein an array of infrared sensors are used to sense the infrared radiation, and an array of silicon photosensors are used to sense selected colors.

12. The method of claim 11 wherein the arrays are vertically integrated into a monolithic silicon substrate to optimize fill factor.

13. A method of forming a dual wavelength focal plane, the method comprising:
    forming an array of visible light pixel elements optimally selective to colors encountered while driving an automobile, the array being formed on a silicon substrate; and
    forming an array of infrared sensing microbolometer pixel elements on top of the array of visible light pixel elements, wherein the infrared sensing pixel elements pass visible light to the array of visible light pixel elements.

14. The method of claim 13, and further comprising forming red, amber and green visible light filters corresponding to the visible light pixel elements.

15. A dual wavelength focal plane comprising:
    a first array of infrared sensing microbolometer pixel elements allowing transmission of visible light;
    a second array of visible light pixel elements selective to vehicle traffic control colors; and
    a thermally isolating space between the first and second arrays.

16. A dual wavelength focal plane comprising:
    a first array of infrared sensing microbolometer pixel elements allowing transmission of visible light;
    a second array of visible light pixel elements;
    a third array of filters positioned above the second array of visible light pixel elements to make such pixel elements selective to vehicle traffic control colors; and
    a thermally isolating space between the first and third arrays.

17. The focal plane of claim 16 wherein the first and second arrays are fabricated on a monolithic silicon substrate.

18. The night display system of claim 17 and further comprising a processor coupled to the arrays and the heads up display controlling the display to show infrared sensed images in monochrome, and visible light sensed images in color.

19. A night display system for an automobile, the system comprising:
    a first array of infrared sensing substantially transparent microbolometer pixel elements;
    a second array of visible light pixel elements selective to vehicle traffic control colors;
    a thermally isolating space between the first and second arrays;
    a heads up display coupled to the arrays for generating an image based on infrared images and visible light corresponding to traffic control signals.

* * * * *